United States Patent
Lang et al.

(10) Patent No.: US 9,692,009 B2
(45) Date of Patent: Jun. 27, 2017

(54) DEVICE AND METHOD FOR PRODUCING HERMETICALLY-SEALED CAVITIES

(71) Applicant: OSRAM OLED GmbH, Regensburg (DE)

(72) Inventors: Erwin Lang, Regensburg (DE); Thilo Reusch, Donaustauf (DE); Philipp Schwamb, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 0 days.

(21) Appl. No.: 14/417,169

(22) PCT Filed: Jul. 18, 2013

(86) PCT No.: PCT/EP2013/065220
§ 371 (c)(1),
(2) Date: Jan. 26, 2015

(87) PCT Pub. No.: WO2014/026823
PCT Pub. Date: Feb. 20, 2014

(65) Prior Publication Data
US 2015/0207101 A1    Jul. 23, 2015

(30) Foreign Application Priority Data
Aug. 14, 2012 (DE) .................. 10 2012 214 411

(51) Int. Cl.
*H01L 51/52* (2006.01)
*H05K 5/06* (2006.01)
(Continued)

(52) U.S. Cl.
CPC ...... *H01L 51/5253* (2013.01); *B81C 1/00269* (2013.01); *C23C 16/45529* (2013.01);
(Continued)

(58) Field of Classification Search
CPC . H01L 51/5256; H01L 51/448; H01L 51/524; H01L 51/5253; H01L 23/564;
(Continued)

(56) References Cited

U.S. PATENT DOCUMENTS 6,503,330 B1 *  1/2003  Sneh ...................... C23C 16/02
                                                        118/715
8,222,811 B2    7/2012  Vaufrey et al.
(Continued)

FOREIGN PATENT DOCUMENTS

CN        1471065 A     1/2004
CN      101292373 A    10/2008
(Continued)

OTHER PUBLICATIONS

Translation of JP2009-199902 A (Gomi) (Sep. 3, 2009) 65 pages.*
(Continued)

*Primary Examiner* — Caridad Everhart
(74) *Attorney, Agent, or Firm* — Viering, Jentschura & Partner mbB

(57) ABSTRACT

An apparatus may include a first support covered with at least one ALD precursor and/or at least one MLD precursor, and a second support covered with at least one ALD precursor and/or at least one MLD precursor which is/are complementary to the ALD precursor and/or MLD precursor of the first support. The first support is at least partly joined to the second support by an atomic bond between the ALD precursor of the first support and the ALD precursor of the second support or between the MLD precursor of the first support and the MLD precursor of the second support in such a way that an ALD layer or an MLD layer is formed.

14 Claims, 7 Drawing Sheets

(51) Int. Cl.
  *H01L 27/32* (2006.01)
  *C23C 16/455* (2006.01)
  *H01L 51/44* (2006.01)
  *B81C 1/00* (2006.01)
  *H01L 23/00* (2006.01)

(52) U.S. Cl.
  CPC .......... *H01L 51/448* (2013.01); *H01L 51/524* (2013.01); *H05K 5/065* (2013.01); *B81C 2201/0197* (2013.01); *B81C 2203/0118* (2013.01); *B81C 2203/031* (2013.01); *H01L 23/564* (2013.01); *H01L 2924/0002* (2013.01); *Y02E 10/549* (2013.01); *Y02P 70/521* (2015.11); *Y10T 428/13* (2015.01)

(58) Field of Classification Search
  CPC ......... H01L 2924/00; H01L 2924/0002; H01L 51/5246; H05K 5/065; C23C 16/45529; Y02E 10/549; Y10T 428/13; Y02P 70/521; B81C 2203/0118
  USPC .......................................... 438/456; 257/101
  See application file for complete search history.

(56) References Cited

U.S. PATENT DOCUMENTS

| | | | |
|---|---|---|---|
| 2004/0004434 A1 | 1/2004 | Nishi et al. | |
| 2004/0060898 A1* | 4/2004 | Tsai | G02B 26/0833 216/2 |
| 2004/0189195 A1 | 9/2004 | Allemand | |
| 2004/0235266 A1 | 11/2004 | Tong | |
| 2006/0131671 A1* | 6/2006 | Hegde | C23C 16/45529 257/406 |
| 2007/0017287 A1* | 1/2007 | Kubena | G01C 19/5684 73/504.02 |
| 2007/0261497 A1* | 11/2007 | O'Brien | G01L 9/0042 73/724 |
| 2008/0105370 A1 | 5/2008 | Schaepkens et al. | |
| 2008/0143928 A1* | 6/2008 | Fukagawa | B32B 17/10018 349/96 |
| 2008/0248648 A1* | 10/2008 | Thompson | C07F 17/00 438/681 |
| 2009/0186242 A1* | 7/2009 | Sato | B32B 37/12 428/671 |
| 2011/0108522 A1 | 5/2011 | Rozing | |
| 2011/0262307 A1 | 10/2011 | Packirisamy et al. | |
| 2013/0295814 A1* | 11/2013 | Wei | B32B 15/085 445/23 |

FOREIGN PATENT DOCUMENTS

| | | | | |
|---|---|---|---|---|
| CN | 102027603 A | | 4/2011 | |
| JP | 2003066868 A | | 3/2003 | |
| JP | 2005011649 A | | 1/2005 | |
| JP | 2009-199902 A | * | 9/2009 | ............ H01L 51/00 |
| JP | 2009199902 A | | 9/2009 | |
| JP | 2013218805 A | | 10/2013 | |
| WO | 2006014591 A2 | | 2/2006 | |
| WO | 2007025140 A1 | | 3/2007 | |
| WO | 2009002892 A1 | | 12/2008 | |
| WO | 2009042051 A2 | | 4/2009 | |
| WO | 2009042052 A2 | | 4/2009 | |
| WO | 2010004124 A1 | | 1/2010 | |

OTHER PUBLICATIONS

Korean Office Action based on Application No. 10-2015-7004232 (7 Pages) dated Jan. 2, 2016 (Reference Purpose Only).
Sung Gap Im et al.: "A conformal nano-adhesive via initiated chemical vapor deposition for microfluidic devices", Lab on a Chip, Royal Society of Chemistry, vol. 9, Nov. 7, 2008, pp. 411-416.
Jingjing Xu: "Amine Functionalization by Initiated Chemical Vapor Deposition (iCVD) for Interfacial Adhesion and Film Cohesion", MIT Library, Electronic PhD Thesis, Jun. 13, 2011, 12 pages.
International Search Report issued for PCT/EP2013/065220 on Dec. 2, 2013.
Chinese Office Action based on Application No. 201380043579.3(8 Pages and 5 pages of English translation) dated Feb. 24, 2016 (Reference Purpose Only).
Japanese Office Action based on Application No. 2015-526915(4 pages of English translation) dated Apr. 11, 2016 (Reference Purpose Only).

* cited by examiner

DEVICE AND METHOD FOR PRODUCING HERMETICALLY-SEALED CAVITIES

RELATED APPLICATIONS

The present application is a national stage entry according to 35 U.S.C. §371 of PCT application No.: PCT/EP2013/065220 filed on Jul. 18, 2013, which claims priority from German application No.: 10 2012 214 411.0 filed on Aug. 14, 2012, and is incorporated herein by reference in its entirety.

TECHNICAL FIELD

Various embodiments relate to apparatuses and a process for producing the apparatus for producing hermetically sealed cavities.

BACKGROUND

Sheet-like organic components, for example organic light-emitting diodes or organic photovoltaic modules, should be protected (encapsulated) against intrusion of damaging materials, for example against intrusion of oxygen and water, since otherwise uncontrolled aging or degradation of the organic materials or mixtures of materials of the organic layers can occur.

A conventional encapsulation process for sheet-like components is cavity encapsulation in which a cavity glass with a getter is adhesively bonded to the sheet-like component. This process is relatively costly and is suitable only for mechanically rigid sheet-like components.

Furthermore, in-situ thin layer encapsulation in which a thin encapsulation layer is produced directly on the sheet-like component (encapsulation) and optionally also on the substrate beneath the component (barrier) is also customary for sheet-like components. Encapsulation has to be carried out in-situ and thereby extends the process flow and increases the manufacturing depth on the component.

Furthermore, lamination of a sheet-like component with barrier films is also customary. Here, sheet-like barrier films are adhesively bonded on and under the sheet-like component, usually with formation of a protective periphery, by adhesively bonding the lower barrier film directly on the upper barrier film. The barrier films are, for example, polymer films which are provided with a barrier layer composed of, for example, $SiO_2$, SiN or metal. However, the intrusion of water and oxygen at the edges of the barrier films is limited merely by the lamination adhesive. However, adhesives known hitherto have only a limited impermeability in respect of water and oxygen. As a result, there is a weak point in the barrier action of the laminated component at the edge of the laminated sheet-like component, and this can lead to leakage at the edge.

SUMMARY

In various embodiments, apparatuses and a process for producing cavities which are hermetically sealed against water and oxygen and by which it is possible, for example, to encapsulate water- and oxygen-sensitive materials, mixtures of materials or components in barrier films in a hermetically sealed manner without conventional adhesives are provided.

For the purposes of the present description, an organic material is a carbon compound which is present, regardless of the respective state of matter, in chemically uniform form and is characterized by characteristic physical and chemical properties. Furthermore, for the purposes of the present description, an inorganic material is a compound without carbon or a simple carbon compound which is present, regardless of the respective state of matter, in chemically uniform form and is characterized by characteristic physical and chemical properties. For the purposes of the present description, an organic-inorganic material (hybrid material) is a compound having parts which contain carbon and parts which are free of carbon which is present, regardless of the respective state of matter, in chemically uniform form and is characterized by characteristic physical and chemical properties. For the purposes of the present description, the term "material" encompasses all abovementioned materials, for example an organic material, an inorganic material and/or a hybrid material. Furthermore, for the purposes of the present description, a mixture of materials is something which consists of constituents composed of two or more different materials whose constituents are, for example, very finely divided. A class of materials is a material or a mixture of materials composed of one or more organic material(s), one or more inorganic material(s) or one or more hybrid material(s).

The process of atomic layer deposition (ALD) makes it possible to produce very thin, functional layers reproducibly in various technical fields, for example in optics, in semiconductor manufacture and in optoelectronics.

Processes in which a layer is produced by introducing the necessary starting materials (precursors) not simultaneously but alternately in succession into a coating chamber, also referred to as reactor, in which the substrate to be coated is present are known by the term "atomic layer deposition". The starting materials can deposit alternately on the surface of the substrate to be coated or on the previously deposited starting material and thus undergo chemical bonding. This makes it possible to grow in each case a maximum of one monolayer of the layer to be applied per cycle repetition, i.e. introduction of the necessary starting materials in successive substeps. Good control of the layer thickness can be achieved via the number of cycles. The starting material introduced first becomes attached only to the surface to be coated and only the second starting material introduced can undergo chemical reactions with the first starting material. The chemical reactions of the starting materials are limited by the number of reaction partners on the surface, i.e. are self-limiting.

A similar self-limiting surface reaction can be employed for the formation of organic films, for example polymer films, for example polyamide. This formation of organic films can be referred to as molecular layer deposition (MLD) since part of a molecule is applied to the surface per cycle. The MLD precursors can have homobifunctional reactants, in other words the starting materials can in each case have two identical functional groups. A self-terminating MLD reaction of each layer can be achieved by heterobifunctional reactants, i.e. each starting material has two different functional groups. One of the functional groups can react with the chemical group of the surface and the other cannot. The heterobifunctional reactants can in this way become only monofunctional and thus prevent a double reaction among one another, which could lead, for example, to termination of the polymer chain.

Apart from heterobifunctioanl reactants, a double reaction can also be realized by a masked or protected function, with the masked or protected function revealing itself only in the reaction.

There are many ring-opening reactions which generate hydroxyl (—OH), amine (—NH$_2$) or carboxylic acid (—COOH). For example, an epoxide ring can react with an amine group on a substrate surface to produce a hydroxyl group. A cyclic azasilane, for example 2,2-dimethoxy-1,6-diaza-2-silacyclooctane, can together with a hydroxyl group on a substrate surface produce an amine group. A cyclic carbonate, for example ethylene carbonate, can together with an amine group on a substrate surface give a hydroxyl group.

The molecular layer deposition of organic polymers and organic-inorganic hybrid polymers can also be performed by a three-stage process. A three-stage process can increase the flexibility of the molecular layer deposition and encompass various organic compositions. In addition, the number of different combinations of possible heterobifunctional reactants which can be used to define the MLD process can be increased by a three-stage process. An example of a three-stage process is, for example, the sequential reaction of trimethylaluminum, ethanolamine and maleic anhydride. This process has a metal alkyl reactant, a heterobifunctional reactant and a ring-opening reactant. This three-stage process avoids the possibility of double reactions and can lead to very robust and linear growth of the molecular layers. Other possible three-stage processes having heterobifunctional reactants, ring-opening reactants and reactants having masked or protected functions can open up a broad palette of possibilities for the molecular layer deposition of organic MLD films and organic-inorganic hybrid MLD films. Furthermore, processes having four or more stages are generally also possible. An example of a four-stage process can have, for example, trimethylaluminum/water/dimethyl-methoxychlorosilane/water to produce a polydimethylsiloxane film (silicone).

Very conformal layer growth can be made possible by ALD and MLD, with surfaces having a large aspect ratio also being able to be covered uniformly.

In various embodiments, an apparatus including: a first support covered with at least one ALD precursor and/or at least one MLD precursor; a second support covered with at least one ALD precursor and/or at least one MLD precursor which is/are complementary to the ALD precursor and/or MLD precursor of the first support; is provided; where the first support is at least partly joined to the second support by an atomic bond between the ALD precursor of the first support and the ALD precursor of the second support or between the MLD precursor of the first support and the MLD precursor of the second support in such a way that an ALD layer or an MLD layer is formed.

In one embodiment, the first support can be mechanically elastic.

In another embodiment, the first support can be sheet-like.

In another embodiment, the first support can have a geometrically complex three-dimensional shape.

In another embodiment, the first support can have a diffusion barrier against damaging materials such as water and/or oxygen.

In another embodiment, the material or the mixture of materials of the first support can have an intrinsic diffusion barrier against damaging materials such as water and/or oxygen.

In another embodiment, the first support can have or be formed by a first system support and a first encapsulation layer and the diffusion barrier of the first support against damaging materials such as water and/or oxygen can be formed by the first encapsulation layer. For the present purposes, a system support can be a self-supporting substrate, for example a film or glass substrate, with the system support also being able to be hermetically sealed only by the encapsulation layer and thus become a hermetically sealed support.

In another embodiment, the first support can have or be formed by an organic material.

In another embodiment, the material of the first support may include a material or an alloy from the group consisting of: iron, steel, aluminum, copper, silver, gold, palladium, magnesium, titanium, platinum, nickel, tin, zinc.

In another embodiment, the material of the first support may include a material from the group of materials consisting of: glass, fused silica, sapphire, silicon carbide, graphene, diamond.

In another embodiment, the material of the first support may include a material or a mixture of materials from the group of materials consisting of semiconductor materials: elementary semiconductors: silicon, germanium, α-tin, carbon compounds, for example fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and also mixed systems: polyvinylcarbazole, TCNQ complexes.

In another embodiment, the first support may include or be formed by an organic material.

In another embodiment, the material of the first support may include or be formed by a material from the group of materials consisting of: polyolefins (for example polyethylene (PE) having a high or low density or polypropylene (PP)), polyvinyl chloride (PVC), polystyrene (PS), polyester, polycarbonate (PC), polyethylene terephthalate (PET), polyether sulfone (PES), polyethylene napthalate (PEN), polymethyl methacrylate (PMMA), polyimide (PI), polyether ketones (PEEK).

In another embodiment, the first support may include or be formed by an organic-inorganic hybrid material.

In another embodiment, the material of the first support may include or be formed by a material from the group of materials consisting of: organically modified ceramics.

In another embodiment, the first support may include or be formed by a mixture of materials.

In another embodiment, the material of the first support may include or be formed by a mixture of materials from the group of materials consisting of: inorganic material, organic material and/or hybrid material.

In another embodiment, the first support may have a thickness of from about 1.0 μm to about 5 μm, with the support being self-supporting.

In another embodiment, the first support may have a thickness of from about 5 μm to about 200 μm.

In another embodiment, the first support may have a thickness of from about 200 μm to about 20 cm.

In another embodiment, the surface of the first support may be structured.

In another embodiment, the surface of the first support may have a microscopically altered surface topography.

The surface topography can have raised regions and/or depressions which are arranged periodically, randomly or individually and have a height or depth of from about 100 nm to about 5 cm and a length and/or width of from about 100 nm to about 1 m. The raised regions or depressions may have any conceivable geometric shape, for example spherical or a segment of a sphere, for example a hemisphere or ⅔ of a sphere, cylindrical, cubic, pyramid-like or polygonal having three or more side faces, or have a geometrically complex shape, for example in the form of a hook or a ring, for example a loop.

In another embodiment, the surface of the first support can have different ALD precursors and/or different MLD precursors.

For example, topographically structured regions of the surface may have different ALD precursors and/or different MLD precursors than unstructured regions.

In another embodiment, the second support may have mechanical elasticity.

In another embodiment, the second support may be sheet-like.

In another embodiment, the second support may have a geometrically complex three-dimensional shape, for example of a canister, drum, hose, wing, boat hull.

In another embodiment, the second support may have a diffusion barrier against damaging materials, for example water and/or oxygen.

In another embodiment, the material or the mixture of materials of the second support may have an intrinsic diffusion barrier against damaging materials such as water and/or oxygen.

In another embodiment, the second support may have or be formed by a second system support and a second encapsulation layer and the diffusion barrier of the second support against damaging materials such as water and/or oxygen can be formed by the second encapsulation layer. A system support can, for the present purposes, be a self-supporting substrate, for example a film or glass substrate, with the system support also being able to be hermetically sealed and thus become a hermetically sealed support only by the encapsulation layer.

In another embodiment, the second support may include or be formed by an inorganic material.

In another embodiment, the material of the second support can have a material or an alloy from the group of materials consisting of: iron, steel, aluminum, copper, silver, gold, palladium, magnesium, titanium, platinum, nickel, tin, zinc.

In another embodiment, the material of the second support can have a material from the group of materials consisting of: glass, fused silica, sapphire, silicon carbide, graphene, diamond.

In another embodiment, the material of the second support can have a material from the group of materials consisting of semiconductor materials: silicon, germanium, α-tin, carbon compounds, for example fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and also mixed systems: polyvinylcarbazole, TCNQ complexes.

In another embodiment, the second support may include or be formed by an organic material.

In another embodiment, the material of the second support may include or be formed by a material from the group of materials consisting of: polyolefins (for example polyethylene (PE) of high or low density or polypropylene (PP)), polyvinyl chloride (PVC), polystyrene (PS), polyester, polycarbonate (PC), polyethylene terephthalate (PET), polyether sulfone (PES), polyethylene napthalate (PEN), polymethyl methacrylate (PMMA), polyimide (PI), polyether ketones (PEEK).

In another embodiment, the second support may include or be formed by an organic-inorganic hybrid material.

In another embodiment, the material of the second support may include or be formed by a material from the group of materials consisting of: organically modified ceramics.

In another embodiment, the second support may include or be formed by a mixture of materials.

In another embodiment, the material of the second support may include or be formed by a mixture of materials from the group of materials consisting of: inorganic material, organic material and hybrid material.

In another embodiment, the second support can have a thickness of from about 0.1 µm to about 5 µm, with the support being self-supporting.

In another embodiment, the second support can have a thickness of from about 5 µm to about 200 µm.

In another embodiment, the second support can have a thickness of from about 200 µm to about 20 cm.

In another embodiment, the surface of the second support can be structured.

In another embodiment, the surface of the second support can have a microscopically altered surface topography.

The surface topography may have raised regions and/or depressions which are arranged periodically, randomly or individually and have a height or depth of from about 100 nm to about 5 cm and a length and/or width of from about 100 nm to about 100 m. The raised regions or depressions can have any conceivable geometric shape, for example spherical or a segment of a sphere, for example hemisphere or ⅔ of a sphere, cylindrical, cubic, pyramid-like or polygonal having three or more side faces, or have a geometric complex shape, for example in the form of a hook or a ring, for example a loop.

In another embodiment, the surface of the second support may have different ALD precursors and/or different MLD precursors.

Here, topographically structured regions of the surface can have different ALD precursors and/or different MLD precursors than unstructured regions. Structured or unstructured regions here relate to the height level of the surface plane which forms the major part of the surface of the support.

In another embodiment, the chemically structured and/or topographically structured surface of the first support can have a structure complementary to the chemically structured and/or topographically structured surface of the second support, i.e. the structured surfaces conform to the key-lock principle, chemically or topographically.

The shear strength and tensile strength of the joining layer can be physically increased by the microscopically complementary structuring of the first system support relative to the second system support. The mechanical durability of the cavity can be increased in this way, for example when a superatmospheric or subatmospheric pressure acts on the cavity. Complementary structures can, for example, be microscopic hooks and loops or raised regions and depressions.

The surface topography of the system supports can have raised regions and/or depressions which are arranged periodically, randomly or individually and have a height or depth of from about 100 nm to about 5 cm and a length and/or width of from about 100 nm to about 100 m. The raised regions or depressions can have any conceivable geometric shape, for example spherical or a segment of a sphere, for example hemisphere or ⅔ of a sphere, cylindrical, cubic, pyramid-like or polygonal having three or more side faces, or a geometric complex shape, for example in the form of a hook or a ring (loop). However, it can also be advantageous to structure only the first support and leave the second support unstructured, i.e. the second support has a smooth surface. The structuring can then be used as encapsulated lead-through, for example for electric contacting of an optoelectronic component within the cavity through the encapsulation.

In a further embodiment, the topographically complementarily structured surface regions of the first support can have the precursors of the second support and the topographically complementarily structured surface regions of the second support can have the precursors of the first support. The formation of a joining layer can then be effected only when the supports are chemically and topographically complementary. This allows exact alignment of the supports relative to one another, for example for electrical, hermetically sealed contacting of the cavity.

In another embodiment, the structuring of the first support and/or of the second support can be effected by localized heating or by catalysis of the joining process of the ALD precursor and/or MLD precursor.

In another embodiment, the ALD precursor(s) of the first support and/or second support may include or be formed by an organic, inorganic or organic-inorganic material.

A nonlimiting selection of materials as ALD precursor is shown by way of example in the following overview.

| Precursor | Precursor complement | Resulting compound |
|---|---|---|
| Trimethylaluminum ($Al(CH_3)_3$-TMA) | $H_2O$; $O_3$; $O_2$ plasma, OH groups | $Al_2O_3$ |
| $BBr_3$ | $H_2O$ | $B_2O_3$ |
| Tris(dimethylamino)silane | $H_2O_2$ | $SiO_2$ |
| $Cd(CH_3)_2$ | $H_2S$ | CdS |
| $Hf[N(Me_2)]_4$ | $H_2O$ | $HfO_2$ |
| $Pd(hfac)_2$ | $H_2$; $H_2$ plasma | Pd |
| $MeCpPtMe_3$ | $O_2$ plasma | $PtO_2$ |
| $MeCpPtMe_3$ | $O_2$ plasma; $O_2$ plasma + $H_2$ | Pt |
| $Si(NCO)_4$; $SiCl_4$ | $H_2O$ | $SiO_2$ |
| TDMASn | $H_2O_2$ | $SnO_2$ |
| $C_{12}H_{26}N_2Sn$ | $H_2O_2$ | $SnO_x$ |
| $TaCl_5$ | $H_2O$ | $Ta_2O_5$ |
| $Ta[N(CH_3)_2]_5$ | $O_2$ plasma | $Ta_2O_5$ |
| $TaCl_5$ | H plasma | Ta |
| $TiCl_4$ | H plasma | Ta |
| $Ti[OCH(CH_3)]_4$; $TiCl_4$ | $H_2O$ | $TiO_2$ |
| $VO(OC_3H_9)_3$ | $O_2$ | $V_2O_5$ |
| $Zn(CH_2CH_3)_2$ | $H_2O$; $H_2O_2$ | ZnO |
| $Zr(N(CH_3)_2)_4)_2$ | $H_2O$ | $ZrO_2$ |
| Bis(ethylcyclopentadienyl)magnesium | $H_2O$ | MgO |
| Tris(diethylamido)(tert-butylimido)tantalum | $N_2H_4$ | TaN |

In another embodiment of the process, the MLD precursor of the first support and/or of the second support may include or be formed by an organic material, inorganic material or organic-inorganic material.

A nonlimiting selection of materials as MLD precursor is shown by way of example in the following overview.

| Precursor | Precursor complement | Resulting compound |
|---|---|---|
| p-Phenylenediamine | Terephthaloyl chloride | Poly(p-phenylene terephthalamide) |
| Trimethylaluminum ($Al(CH_3)_3$-TMA) | Ethylene glycol; | $(-O-Al-O-C_2H_4-)_n$ "alucone"; poly(aluminum methylene glycol) |
| Trimethylaluminum ($Al(CH_3)_3$-TMA) | Ethanolamine | $(-N-Al-O-C_2H_{4-})_n$ |
| Trimethylaluminum ($Al(CH_3)_3$-TMA) | Glycerol | Of the "alucone" type |
| Diethyl zinc $Zn(CH_2CH_3)_2$ | Diols, for example ethylene glycol; | $(-O-Zn-O-C_{18}H_4-)_n$ "zincone" |
| 1,6-Hexanediamine | $C_6H_8Cl_2O_2$ (adipoyl chloride) | Nylon 66 |
| $TiCl_4$ | Diols, for example ethylene glycol | "titanicone" |
| $Zr[OC(CH_3)_3]_4$ Zirconium tetra-t-butoxide | Diols, for example ethylene glycol | "zircone" |
| Metal-alkyl derivative; for example triethylaluminum, triisobutylaluminum | Diols, for example ethylene glycol | Metal-cone |
| Trimethylaluminum ($Al(CH_3)_3$-TMA) | Carboxy derivative (R—COOH) | R—COO—$(Al(CH_3)_2)$* |
| Dimethylaluminum R—COO—$(Al(CH_3)_2)$* | Diols, for example ethylene glycol | Al—$OCH_2CH_2NH_2$* |
| Al—$OCH_2CH_2NH_2$ | Maleic anhydride $C_4H_2O_3$ | R—NH—C(O)CHCHCOOH* |
| $Zn(CH_2CH_3)_2$ | Hydroquinone | "Zincone" |
| $Mg(EtCp)_2$ | Diols, carboxy groups | "Magcone" |
| $Mn(EtCp)_2$ | Diols, carboxy groups | "Mancone" |

MLD layers have a greater flexibility than purely inorganic layers. MLD layers make it possible to form polyimides or other combinations of ALD layers and MLD layers by a combination of the appropriate precursors. Such layers can, in particular, be particularly suitable as bases for surface reaction.

In another embodiment, application of ALD precursor and/or MLD precursor to the surfaces of the first support and the second support can lead to a reactive precursor on the surface of the first support and second support.

In another embodiment, the ALD layer and/or MLD layer of the compound of the ALD precursor and/or MLD precursor of the first support can together with the ALD precursor and/or MLD precursor of the second support join the first support contiguously without leaving gaps to the second support in such a way that the ALD layer and/or MLD layer encloses a cavity between the first support and the second support.

In another embodiment, the atomic bonding of the ALD precursor and/or the MLD precursor of the first support to the ALD precursor and/or MLD precursor of the second support to form an ALD layer or an MLD layer can be effected by altering the temperature and/or irradiation with electromagnetic radiation.

In another embodiment, the atomic bonding of the ALD precursor and MLD precursor by altering the temperature may include increasing the temperature.

In another embodiment, the atomic bonding of the ALD precursor and MLD precursor by increasing the temperature can be carried out up to about 150° C.

In another embodiment, the bonding of the ALD precursor and MLD precursor to form ALD layers and/or MLD layers by electromagnetic radiation can be effected by action of X-rays or UV radiation.

In another embodiment, the bonding of the ALD precursor or MLD precursor to form ALD layers or MLD layers by electromagnetic radiation and altering the temperature can be effected by increasing the temperature after irradiation of the place of joining of the first support to the second support with microwaves.

In another embodiment, the cavity can be hermetically sealed against diffusion flows of damaging materials such as water and oxygen.

In another embodiment, an organic component can be encapsulated in the cavity.

In another embodiment, the surface of the first support or of the second support can be parallel supports of the component to be encapsulated or be the component to be encapsulated.

In another embodiment, a liquid or gas can be encapsulated in the cavity between the first support and the second support by the hermetically sealed joining of the first support to the second support.

A support having a diffusion barrier can be considered to be synonymous with a hermetically sealed support. The contiguous joining without gaps of the first hermetically sealed support to the second hermetically sealed support creates a cavity between the first encapsulation layer and the second encapsulation layer. The direct joining of the diffusion barriers of the two supports is important here. No diffusion of gaseous or liquid materials such as water and/or oxygen out of or into this cavity is possible. The cavity is the space between the first support and the second support, which is spanned by the first support and the second support. Sheet-like, flexible shaped supports can, for example, be films and geometrically complex shapes which are formed by folding of films. The first support and the second support can have a joint system support. A system support can for the present purposes be a self-supporting substrate, for example a film or glass substrate, with the system support also being able to be hermetically sealed and thus become a hermetically sealed support only by the encapsulation layer.

A joint system support for the first support and the second support can, for example, be made up of various regions on the system support, for example geometrically opposite margins of a sheet-like, flexible system support, for example a film.

Geometrically complex shapes can have, for example, the shape of a canister, drum, hose, wing, a support surface or a hull of a boat. The areal extension, i.e. the length and width, of the first support and/or of the second support can be from about 1 cm to about 100 m. The areal extension of the supports can have a square, rectangular, round or accurately fitting shape. A length of a system support of about 100 m can, for example, be advantageous in the case of a film on a roll in a roll-to-roll process. The areal extension of the second system support, for example some $cm^2$, can be very much smaller than the areal extension of the first support, for example a few $m^2$, for example when using the second support as repair patch for the first support. The areal extension of the second support when used as repair patch can, for example, be matched in an accurately fitting manner (with overlap for the joining layer) to the areal extension of the repair position in, on or under the first support.

A sheet-like support having a complex shape can in turn have subregions which are structured in a complex manner and can be supports, in the example of the hull of a boat, for example a hole in the hull of the boat. The first support can then be the region of the boat hull having the hole, while the second support can be configured as a repair patch. The repair patch can seal the hole in the boat hull against diffusion of water by the ALD layer or MLD layer, i.e. the hole in the boat hull can be the object to be protected against diffusion of water in the cavity between first support and second support, i.e. the first support can have an open sheet-like surface.

The cavity can, for example, be used as protective space for organic components for protection against intrusion of water and/or oxygen. However, the cavity can also prevent exit of water with simultaneous intrusion of oxygen, for example as hermetically sealed, for example anaerobic, protective space for perishable liquids, for example water, wine, medicaments. Apart from the property as diffusion barrier in respect of water and oxygen, the encapsulation layer can also have a disinfecting effect, for example in the case of silver-containing materials or mixtures of materials of the encapsulation layer. Silver is known for its disinfecting properties and can, for example, prevent or reduce the formation of bacteria, for example for the storage of water, wine or medicaments in sealed cavities, known as hoses or tubes.

In various embodiments, a process for producing an apparatus is provided, with the process including: application of at least one ALD precursor and/or at least one MLD precursor to a first support; application of at least one ALD precursor and/or at least one MLD precursor to a second support, where the ALD precursor and/or the MLD precursor applied to the second support is complementary to the ALD precursor and/or MLD precursor applied to the first support; and joining of the at least one ALD precursor and/or the at least one MLD precursor applied to the first support to the complementary at least one ALD precursor and/or the complementary at least one MLD precursor applied to the second support; where the first support is at least partly joined to the second support by an atomic bond between the ALD precursor applied to the first support and the ALD precursor applied to the second support or between the MLD precursor applied to the first support and the MLD precursor applied to the second support in such a way that an ALD layer or an MLD layer is formed.

In one embodiment of the process, the first support can be mechanically elastic, also referred to as flexible.

In another embodiment of the process, the first support can be sheet-like.

In another embodiment of the process, the first support can have a geometrically complex three-dimensional shape.

In another embodiment of the process, the first support can have a diffusion barrier against water and/or oxygen.

In another embodiment of the process, the material or the mixtures of materials of the first support can have an intrinsic diffusion barrier against water and/or oxygen.

In another embodiment of the process, the first support can have or be formed by a first system support and a first encapsulation layer and the diffusion barrier of the first support against water and/or oxygen can be formed by the first encapsulation layer.

In another embodiment of the process, the first support can have or be formed by an inorganic material.

In another embodiment, the material of the first support may include a material or an alloy from the group of materials consisting of: iron, steel, aluminum, copper, silver, gold, palladium, magnesium, titanium, platinum, nickel, tin, zinc.

In another embodiment, the material of the first support may include a material from the group of materials consisting of: glass, fused silica, sapphire, silicon carbide, graphene, diamond.

In another embodiment, the material of the first support may include a material from the group of materials consisting of semiconductor materials: silicon, germanium, α-tin, carbon compounds, for example fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and also mixed systems: polyvinylcarbazole, TCNQ complexes.

In another embodiment, the first support may include or be formed by an organic material.

In another embodiment, the material of the first support may include or be formed by a material from the group of materials consisting of: polyolefins (for example polyethylene (PE) of high or low density or polypropylene (PP)), polyvinyl chloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketones (PEEK).

In another embodiment of the process, the first support can have or be formed by an organic-inorganic hybrid material.

In another embodiment of the process, the material of the first support may include or be formed by a material from the group of materials consisting of: organically modified ceramics.

In another embodiment of the process, the first support can have or be formed by a mixture of materials.

In another embodiment of the process, the material of the first support may include or be formed by a mixture of materials from the group of materials consisting of: inorganic material, organic material and hybrid material.

In another embodiment of the process, the first support can have a thickness of from about 0.1 µm to about 5 µm, with the support being self-supporting.

In another embodiment of the process, the first support can have a thickness of from about 5 µm to about 200 µm.

In another embodiment of the process, the first support can have a thickness of from about 200 µm to about 20 cm.

In another embodiment of the process, the surface of the first support can be structured.

In another embodiment of the process, the structuring of the surface of the first support or first system support can be a microscopic alteration of the surface topography before coating of the surface of the first support with ALD precursor and/or MLD precursor.

In another embodiment of the process, the surface of the first support may include or be formed by different ALD precursors and/or different MLD precursors.

In another embodiment of the process, the second support can be mechanically elastic.

In another embodiment of the process, the second support can be sheet-like.

In another embodiment of the process, the second support can have a geometrically complex three-dimensional shape.

In another embodiment of the process, the second support can have a diffusion barrier against water and/or oxygen.

In another embodiment of the process, the material or the mixture of materials of the second support can have an intrinsic diffusion barrier against water and/or oxygen.

In another embodiment of the process, the second support can have or be formed by a second system support and a second encapsulation layer and the diffusion barrier of the second support against water and/or oxygen can be formed by the second encapsulation layer.

In another embodiment of the process, the second support can have or be formed by an inorganic material.

In another embodiment, the material of the second support may include a material or an alloy from the group of materials consisting of: iron, steel, aluminum, copper, silver, gold, palladium, magnesium, titanium, platinum, nickel, tin, zinc.

In another embodiment, the material of the second support may include a material from the group of materials consisting of: glass, fused silica, sapphire, silicon carbide, graphene, diamond.

In another embodiment, the material of the second support may include a material from the group of materials consisting of semiconductor materials: silicon, germanium, α-tin, carbon compounds, for example fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and also mixed systems: polyvinylcarbazole, TCNQ complexes.

In another embodiment, the second support can have or be formed by an organic material.

In another embodiment, the material of the second support may include or be formed by a material from the group of materials consisting of: polyolefins (for example polyethylene (PE) of high or low density or polypropylene (PP)), polyvinyl chloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketones (PEEK).

In another embodiment of the process, the second support can have or be formed by an organic-inorganic hybrid material.

In another embodiment of the process, the material of the second support may include or be formed by a material from the group of materials consisting of: organically modified ceramics.

In another embodiment of the process, the second support can have or be formed by a mixture of materials.

In another embodiment of the process, the material of the second support may include or be formed by a mixture of materials from the group of materials consisting of: inorganic material, organic material and hybrid material.

In another embodiment of the process, the second support can have a thickness of from about 0.1 µm to about 5 µm, with the support being self-supporting.

In another embodiment of the process, the second support can have a thickness of from about 5 µm to about 200 µm.

In another embodiment of the process, the second support can have a thickness of from about 200 µm to about 20 cm.

In another embodiment of the process, the surface of the second support can be structured.

In another embodiment of the process, the structuring of the surface of the second support or second system support may include a microscopic alteration of the surface topography before application of the surface of the second support with ALD precursor and/or MLD precursor or before application of the second system support having the encapsulation layer.

In another embodiment of the process, the surface of the second support can have or be formed by different ALD precursors and/or different MLD precursors.

In another embodiment of the process, the chemically structured and/or topographically structured surface of the first support can be complementary to the chemically structured and/or topographically structured surface of the second support.

In another embodiment of the process, structuring of the first support and/or of the second support can be effected by localized heating or by catalysis of the bonding process of the ALD or MLD precursor.

The structuring of the supports can be effected by conventional photolithographic processes (masking, illumination and etching of the system supports) or by application of joiner layers having locally different thicknesses by conventional photolithographic processes, chemical catalysis of the precursors or local heating.

In another embodiment of the process, the ALD precursors of the first support and/or second support may include or be formed by an organic, inorganic or organic-inorganic material.

In another embodiment of the process, the application of ALD and/or MLD precursor to the surfaces of the first support and the second support can lead to a reactive precursor on the surface of the first support or second support.

In another embodiment of the process, the ALD layer and/or MLD layer of the compound of the ALD precursor and/or MLD precursor of the first support can together with the ALD precursor and/or MLD precursor of the second support join the first support contiguously without gaps to the second support in such a way that the ALD layer and/or MLD layer encloses a cavity between the first support and the second support.

After alignment of the second support relative to the first support, the joining layer can be formed by a hot embossing process, with the punch in the hot embossing process being matched to the geometric edges of the supports with joiner layers.

In another embodiment of the process, bonding of the ALD precursor and/or MLD precursor of the first support to the ALD precursor and/or MLD precursor of the second support to form the ALD layer or MLD layer can be effected by altering the temperature and/or irradiation with electromagnetic radiation.

In another embodiment of the process, the bonding of the ALD precursor and MLD precursor to form ALD layers and/or MLD layers by changing the temperature can be effected by increasing the temperature.

In another embodiment of the process, the bonding by increasing the temperature can be carried out up to about 150° C.

In another embodiment of the process, the bonding of the ALD precursor and MLD precursor to form ALD layers and/or MLD layers by electromagnetic radiation can be carried out by action of X-rays or UV radiation.

In another embodiment of the process, the bonding of the ALD precursor and MLD precursor to form ALD layers and/or MLD layers by electromagnetic radiation and increasing the temperature can be carried out as a result of irradiation of the place of joining of the first support to the second support with microwaves.

In another embodiment of the process, the cavity can be hermetically sealed against diffusion flows of water and oxygen.

In another embodiment of the process, an organic component can be encapsulated in the cavity.

In another embodiment of the process, the surface of the first support or second support can be parallel supports of the component to be encapsulated or be the component to be encapsulated.

In another embodiment of the process, an aqueous liquid can be encapsulated in the cavity between a first support and a second support by the hermetically sealed joining of the first support to the second support.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
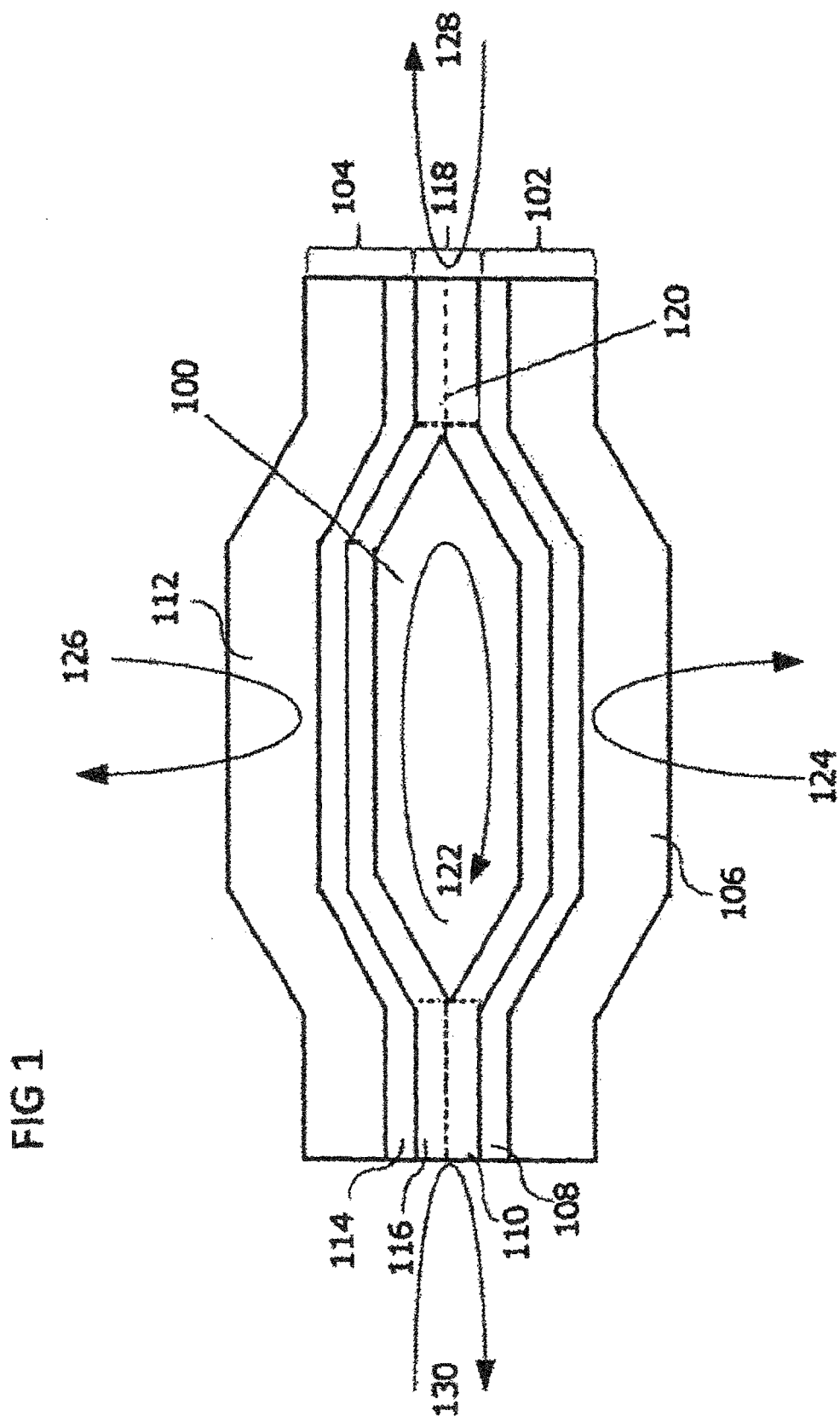
FIG. 1 shows a schematic cross-sectional view of a hermetically sealed cavity.

In the following comprehensive description, reference is made to the accompanying drawings which form part of this and in which specific embodiments in which the disclosure can be performed are shown for the purpose of illustration. In this context, directional terminology such as "top", "below", "at the front", "behind", "front", "back", etc., are used in relation to the orientation of the figure(s) described. Since components of embodiments can be positioned in a number of different orientations, the directional terminology serves for the purpose of illustration and is not limiting in any way. It goes without saying that other embodiments can be utilized and structural or logical changes can be made without going outside the scope of protection of the present disclosure. It goes without saying that the features of the various illustrative embodiments described here can be combined with one another unless specifically indicated otherwise. The following comprehensive description should therefore not be interpreted in a restrictive sense and the scope of protection of the present disclosure is defined by the accompanying claims.

For the purposes of the present description, the terms "joined", "connected" and "coupled" are used for describing both a direct and indirect join, a direct or indirect connection and a direct or indirect coupling. In the figures, identical or similar elements are provided with identical reference numerals, insofar as this is useful.

FIG. 1 shows a hermetically sealed cavity 100 between a hermetically sealed first support 102 and a hermetically sealed second support 104. The hermetically sealed first support 102 can have a first system support 106, a first encapsulation layer 108 and a first joiner layer 110. The hermetically sealed second support 104 can have a second system support 112, a second encapsulation layer 114 and a second joiner layer 116. In the joining layer 118, the hermetically sealed first support 102 can be in physical contact 120 with the hermetically sealed second support 104 and be atomically bonded thereto.

The first encapsulation layer 108, the second encapsulation layer 114 and the joining layer 118 can be considered to be impermeable to water and oxygen, i.e. hermetically sealed against water and oxygen. The system supports 106, 112 can become hermetically sealed supports 102, 104 by the encapsulation layers 108, 114. The contiguous joining without gaps of the first hermetically sealed support 102 to the second hermetically sealed support 104 can form a cavity 100 between the first encapsulation layer 108 and the second encapsulation layer 114. The cavity 100, i.e. the visible space spanned between the supports 102, 104, can be protected against diffusion of water and oxygen out of the cavity 122 or diffusion of water and oxygen into the cavity 124, 126, 128, 130 by the encapsulation layers 108, 114 and the joining layer 118.

The first system support 106 and/or the second system support 112 can be mechanically elastic, sheet-like and/or geometrically complex. Sheet-like flexible shapes can be, for example, films and geometrically complex shapes formed by folding of films.

The first system support 106 and/or the second system support 112 can be formed by an organic material or mixture of materials, for example polyolefins (for example polyethylene (PE) of high or low density or polypropylene (PP)), polyvinyl chloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketones (PEEK); an inorganic material or an alloy from the group of materials consisting of: iron, steel, aluminum, copper, silver, gold, palladium, magnesium, titanium, platinum, nickel, tin, zinc; from the group of materials consisting of: glass, fused silica, sapphire, silicon carbide, graphene, diamond, from the group of materials consisting of semiconductor materials: silicon, germanium, α-tin, carbon compounds, for example fullerenes, boron, selenium, tellurium; compound semiconductors: indium, gallium, arsenic, phosphorus, antimony, nitrogen, zinc, cadmium, beryllium, mercury; organic semiconductors: tetracene, pentacene, phthalocyanines, polythiophene, PTCDA, MePTCDI, quinacridone, acridone, indanthrone, flavanthrone, perinone, Alq3; and also mixed systems: polyvinylcarbazole, TCNQ complexes, or a hybrid material, for example organically modified ceramic.

The first system support 106 and/or the second system support can have a thickness of from about 1 μm to about 20 cm, for example from about 1 μm to about 200 μm; for example from about 200 μm to about 2 mm; for example from about 2 mm to about 1 cm; for example from about 1 cm to about 20 cm.

The areal extension, i.e. the length and width, of the first system support 106 and/or of the second system support 112 can be from about 1 cm to about 100 m. The areal extensions of the system supports 106, 112 can have a square, rectangular, round or accurately fitting shape. A length of a system support 106, 112 of about 100 m can be advantageous, for example in the case of a film on a roll in a roll-to-roll process. The areal extension of the second system support 112, for example some $cm^2$, can be very much smaller than the areal extension of the first support 106, for example some $m^2$, for example when the second support 104 is used as repair patch for the first support 102. The areal extension of the second support 104 when used as repair patch can, for example, be matched in an accurately fitting manner (with overlap for the joining layer 118) to the areal extension of the place of repair in, on or under the first support 102.

The first encapsulation layer 108, the second encapsulation layer 114 and the joining layer 118 can prevent diffusion of water or oxygen through the sheet-like side 124, 128 of the first system support 106 or of the second system support 112 into or out of the cavity 100. The encapsulation layers 108, 114 can be in physical contact with their respective system supports 106, 112 and have a layer thickness of from about 1 nm to a maximum of about 1 mm, for example from about 1 nm to about 50 nm; for example from about 50 nm to about 200 nm; for example from about 200 nm to about 100 μm. As materials for the encapsulation layers 108, 114, it is possible to use, for example, aluminum oxide, zinc oxide, zirconium oxide, titanium oxide, hafnium oxide, tantalum oxide, lanthanum oxide, silicon oxide, silicon nitride, silicon oxynitride, indium tin oxide, indium-zinc oxide, aluminum-doped zinc oxide and also mixtures and alloys thereof as material.

The first encapsulation layer 108 and the second encapsulation layer 114 can have an identical or different chemical composition and/or layer thickness. If, for example, the cavity 100 is exposed more to water and/or oxygen on one side, for example 124, the first encapsulation layer 108 can have encapsulation with a different material, a greater density and/or layer thickness compared to the second support 104.

If a system support 106 or 112 has an intrinsic diffusion barrier against water and oxygen, an additional encapsulation layer 108 or 114 can be dispensed with, for example when the system support is formed by glass or a metal. In this case, the system support 106 or 112 can become the hermetically sealed support 102 or 104.

The cavity 100 can be used as protective space for organic components to protect them against intruding water and/or oxygen 124, 126, 128, 130. However, the cavity can also prevent exit of water with simultaneous intrusion of oxygen, for example as hermetically sealed, for example anaerobic, protective space for perishable liquids, for example, water, wine, medicaments. Apart from the property as diffusion barrier against water and oxygen, the encapsulation layer 108 or 114 can also have a disinfecting effect, for example in the case of silver-containing material or mixtures of materials of the encapsulation layer. Silver is known for its disinfecting properties and can, for example, prevent or reduce the formation of bacteria, for example for the storage of water, wine or medicaments.

Figure 2:
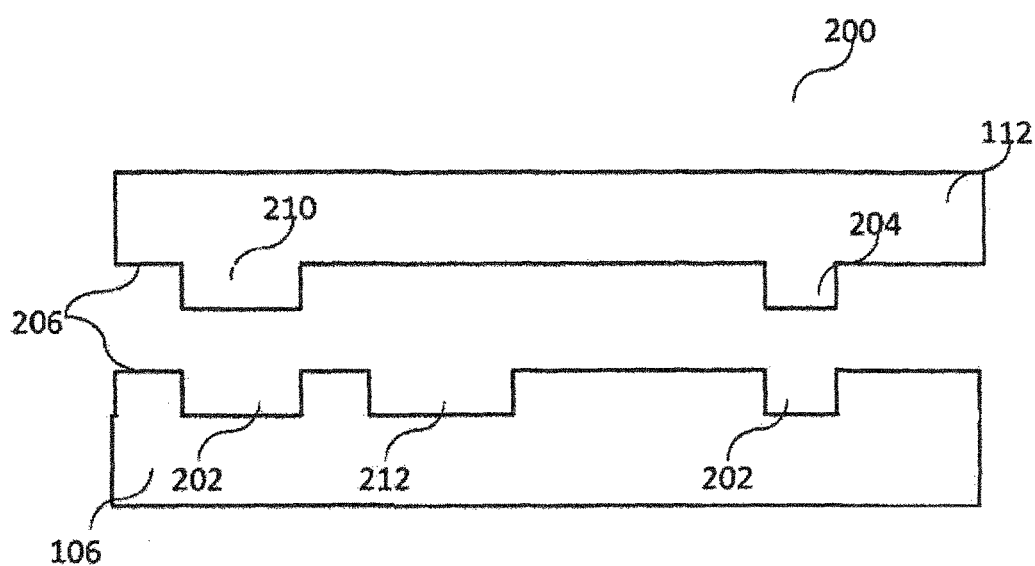
FIG. 2 shows a schematic cross-sectional view of structured system supports.

FIG. 2 shows a schematic cross-sectional view of structured system supports. Depending on the use, it can be advantageous to structure the first system support 106 and/or second system support 112 topographically locally 202, 204, 208, 210, 212 and leave other regions unstructured 206 before application of the encapsulation layers 108, 114 and the joiner layers 110, 116 or in the case of intrinsic encapsulation of the system support 106 or 112 before application of the joiner layers 110, 116, with the unstructured plane 206 of the first support 102 and of the second support 104 being the reference level for the raised regions and depressions.

The structures of the first system support 106 and second system support 112 can be topographically complementary to one another 202 to 204, 208 to 210, or only one of the system supports can be structured 212 while the other system support is left unstructured 206.

The shear strength and/or tensile strength of the joining layer 118 can be physically increased by the microscopically complementary structures 202, 204, 208, 212 of the first system support 106 and the second system support 112. In this way, the mechanical durability of the cavity 100 can be increased, for example when a superatmospheric or subatmospheric pressure acts on the cavity 100. Complementary structures can, for example, be microscopic hooks and loops or raised regions 204, 210 and depressions 208, 202.

The surface topography of the system supports 106, 112 can have raised regions 204, 210 and/or depressions 202, 208, 212 which are arranged periodically, randomly or individually and have a height or depth of from about 100 nm to about 5 cm and a length and/or width of from about 100 nm to about 100 m. The raised regions 204, 210 or depressions 202, 208, 212 can have any conceivable geometric shape, for example spherical or a segment of a sphere, for example hemisphere or ⅔ of a sphere, cylindrical, cubic, pyramid-like or polygonal having three or more side faces, or a geometric complex shape, for example in the form of a hook or a ring (loop). However, it can also be advantageous to structure 212 only the first support 106 and leave the second support 112 unstructured 206, i.e. the second support 112 can have a smooth surface 206. The structure 212 can then be used as encapsulated lead-through for example for the electric contacting of an optoelectronic component inside the cavity 100 through the encapsulation 108, 114.

The structuring of the supports 102, 104 can be carried out by conventional photolithographic processes (masking, illumination and etching of the system supports 106, 112) or by application of joiner layers 110, 116 having locally different thicknesses, chemical catalysis of the precursors or local heating or by embossing.

Figure 3:
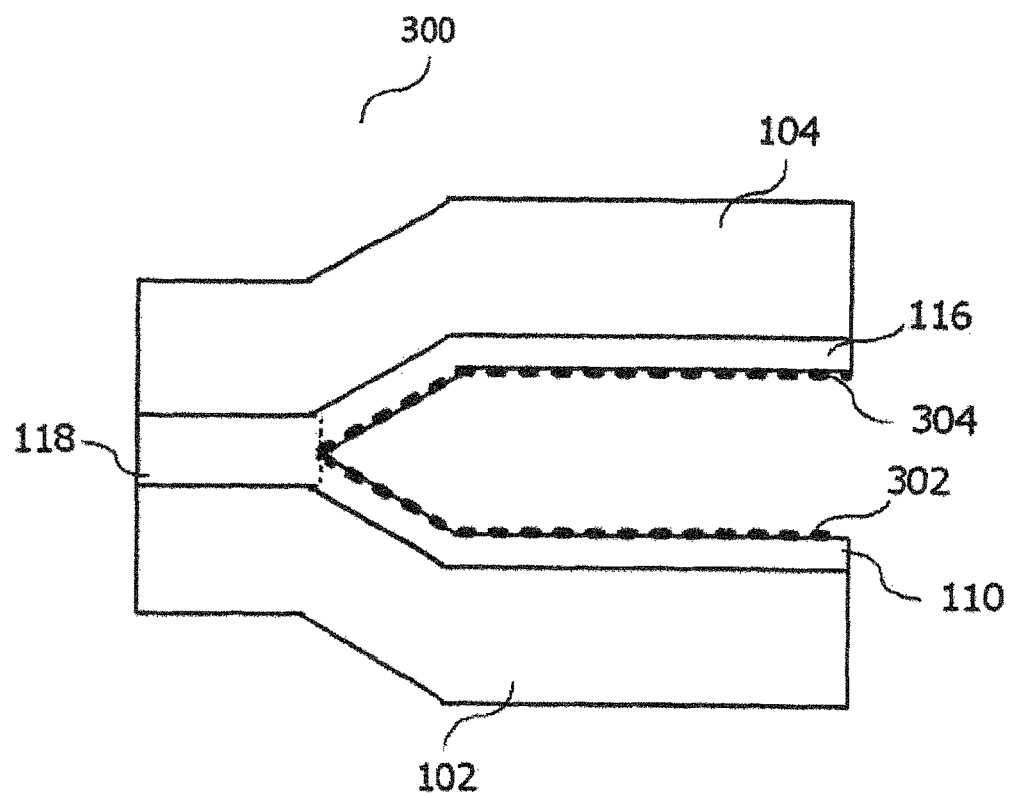
FIG. 3 shows a schematic cross-sectional view of the principle of ALD or MLD bonding.

FIG. 3 shows a schematic cross-sectional view of the principle of ALD or MLD bonding or the hermetically sealed joining 300 of a first hermetically sealed support 104 to a second hermetically sealed support 104 by formation of a joining layer 118.

Joiner layers 110, 116 having reactive surfaces 302, 304 are deposited on the first support 102 and the second support 104. The reactive surfaces 302, 304 have reactive ALD precursors and/or MLD precursors. The precursors of the first support 302 can be complementary to the precursor of the second support 304.

A nonlimiting selection of materials as ALD precursor or MLD precursor is shown by way of example in the following overview.

| Precursor | Precursor complement | Resulting compound |
|---|---|---|
| Trimethylaluminum (Al(CH$_3$)$_3$-TMA) | H$_2$O; ethylene glycol; O$_3$; O$_2$ plasma, OH groups | Al$_2$O$_3$ |
| BBr$_3$ | H$_2$O | B$_2$O$_3$ |
| Tris(dimethylamino)silane | H$_2$O$_2$ | SiO$_2$ |
| Cd(CH$_3$)$_2$ | H$_2$S | CdS |
| Hf[N(Me$_2$)]$_4$ | H$_2$O | HfO$_2$ |

-continued

| Precursor | Precursor complement | Resulting compound |
|---|---|---|
| Pd(hfac)$_2$ | H$_2$; H$_2$ plasma | Pd |
| MeCpPtMe$_3$ | O$_2$ plasma | PtO$_2$ |
| MeCpPtMe$_3$ | O$_2$ plasma; O$_2$ plasma + H$_2$ | Pt |
| Si(NCO)$_4$; SiCl$_4$ | H$_2$O | SiO$_2$ |
| TDMASn | H$_2$O$_2$ | SnO$_2$ |
| C$_{12}$H$_{26}$N$_2$Sn | H$_2$O$_2$ | SnO$_x$ |
| TaCl$_5$ | H$_2$O | Ta$_2$O$_5$ |
| Ta[N(CH$_3$)$_2$]$_5$ | O$_2$ plasma | Ta$_2$O$_5$ |
| TaCl$_5$ | H plasma | Ta |
| TiCl$_4$ | H plasma | Ta |
| Ti[OCH(CH$_3$)]$_4$; TiCl$_4$ | H$_2$O | TiO$_2$ |
| VO(OC$_3$H$_9$)$_3$ | O$_2$ | V$_2$O$_5$ |
| Zn(CH$_2$CH$_3$)$_2$ | H$_2$O; H$_2$O$_2$ | ZnO |
| Zr(N(CH$_3$)$_2$)$_4$)$_2$ | H$_2$O | ZrO$_2$ |
| Bis(ethylcyclopentadienyl)magnesium | H$_2$O | MgO |
| Tris(diethylamido)(tert-butylimido)tantalum | N$_2$H$_4$ | TaN |
| p-Phenylenediamine | Terephthaloyl chloride | Poly(p-phenylene terephthalamide) |
| 1,6-Hexanediamine | C$_6$H$_8$Cl$_2$O$_2$ (adipoyl chloride) | Nylon 66 |
| Trimethylaluminum (Al(CH$_3$)$_3$-TMA) | Ethylene glycol; | (—O—Al—O—C$_2$H$_4$—)$_n$ "alucone" |
| Trimethylaluminum (Al(CH$_3$)$_3$-TMA) | Ethanolamine | (—N—Al—O—C$_2$H$_4$—)$_n$ |
| Trimethylaluminum (Al(CH$_3$)$_3$-TMA) | Glycerol | Of the "alucone" type |
| Zn(CH$_2$CH$_3$)$_2$ | Ethylene glycol; | (—O—Zn—O—C2H4—)n "Zincone" |
| TiCl$_4$ | Diols, for example ethylene glycol | "Titanicone" |
| Zr(OC(CH$_3$)$_3$)$_4$ zirconium tetra-t-butoxide | Diols, for example ethylene glycol | "Zircone" |
| Metal alkyl derivative; for example triethylaluminum, triisobutylaluminum | Diols, for example ethylene glycol | Metal-cone |
| Trimethylaluminum (Al(CH$_3$)$_3$-TMA) | Carboxy derivative (R—COOH) | R—COO—Al(CH$_3$)$_2$* |
| Dimethylaluminum R—COO—(Al(CH$_3$)$_2$* | Diols, for example ethylene glycol | Al—OCH$_2$CH$_2$NH$_2$* |
| Al—OCH$_2$CH$_2$NH$_2$ | Maleic anhydride C$_4$H$_2$O$_3$ | R—NH—C(O)CHCHCOOH* |
| Zn(CH$_2$CH$_3$)$_2$ | Hydroquinone | "Zincone" |
| Mg(EtCp)$_2$ | Diols, carboxy groups | "Magcone" |
| Mn(EtCp)$_2$ | Diols, carboxy groups | "Mancone" |

The application of ALD precursor or MLD precursor to the surface of the hermetically sealed support 102, 104 is sketched, without restricting the generality, for the example of the first support 102.

Before application of the precursor to the surface of the hermetically sealed support 102, the surface may be pretreated, for example by smoothing, roughening, wet-chemical formation of hydroxyl or gold groups on the surface of the hermetically sealed support 102.

One or more layers of one or more ALD precursors and/or MLD precursors can be deposited on the surface of the hermetically sealed support 102. The application of the precursor can be carried out over the entire surface 202, 206, 208 or only partly to regions of the surface of the hermetically sealed support 102, for example only to 202, 208 or at the geometric edges of the sheet-like surface of the first support 102 (not shown). The application of precursor to subregions of the surface of the first support 102 can be limited by conventional photolithographic processes.

To apply the joiner layer 110 having the reactive surface 302, reactive complementary precursors can be passed sequentially in gaseous form or wet-chemically over the surface of the hermetically sealed support 102. The ALD precursors or MLD precursors can react with the respective exposed surface of the first support 102 or the previously formed parts of the joiner layer 110 and form an atomic bond when the respective surface has the respective precursor complement. This reaction can be self-terminating for each precursor and excess ALD precursor or MLD precursor can be pumped away. The joiner layer 110 can be applied to the surface of the hermetically sealed support by successive, layer-wise deposition of complementary precursors—hence the term ALD (atomic layer deposition) or MLD (molecular layer deposition). The exposed precursor layer of the joiner layer 110 can form the reactive precursor surface 302. This can be important for the formation of an atomic bond in the joining layer 118 with the precursor complement 304 of the second support 104.

The reactive ALD surfaces or MLD precursor surfaces 302 and 304 of the joiner layers 110, 116 can, when in physical contact 120, lead to formation of the joining layer 118, i.e. the ALD precursors and/or MLD precursors of the reactive surfaces 302 and 304 can, when in physical contact 120, form an atomically bonded ALD layer and/or MLD layer.

The formation of the atomic bond can, for example, be effected by introduction of energy in a dry-chemical process. The introduction of energy can, depending on the ALD precursor or MLD precursor, be carried out by, for example, increasing the temperature, introducing electromagnetic radiation, for example X-rays or UV radiation; or by increasing the temperature as a result of the action of electromagnetic radiation, for example microwaves.

The joining layer 118 can join the first support 102 to the second support 106 contiguously without leaving gaps at least at the geometric edges of the encapsulation layer of one of the supports 102, 104. The joining layer 118 can be impermeable to water and oxygen. The joiner layers 110 and 116 can, in the contact region 120 of the first support 102 to the second support 104, become the joining layer 118 after the atomic bonding of the precursor 302 to 304.

The layer-wise application of the precursor to the first support 102 can also bring about structuring of the surfaces, for example by producing a planar 206 reactive surface 302 for joining to the reactive surface 304 of the second support 104 or forming topographical structures 204, 210.

In a further example, precursors of the second support 104 can be applied to the topographically complementarily structured surface regions of the first support 202, 208 and the precursors of the first support 302 can be applied to the surface regions of the second support 204, 210 which are topographically complementarily structured to the first support 102. The formation of a joining layer 118 can then be effected only when the supports 102, 104 are chemically and topographically complementary. This can aid alignment of the supports 102, 104 relative to one another, for example for electronic contacting of the cavity.

Production of different precursor regions as reactive surface 302, 304 can be carried out using conventional lithographic processes (masks); for example, a mask which prevents atomic bonding of the precursor layer 302 or 304 to the joiner layer 110 or 116 can be placed on the previously formed joiner layer 110 or 116 in the last step for producing 110, 116 before formation of the reactive surface 302, 304.

Figure 4:
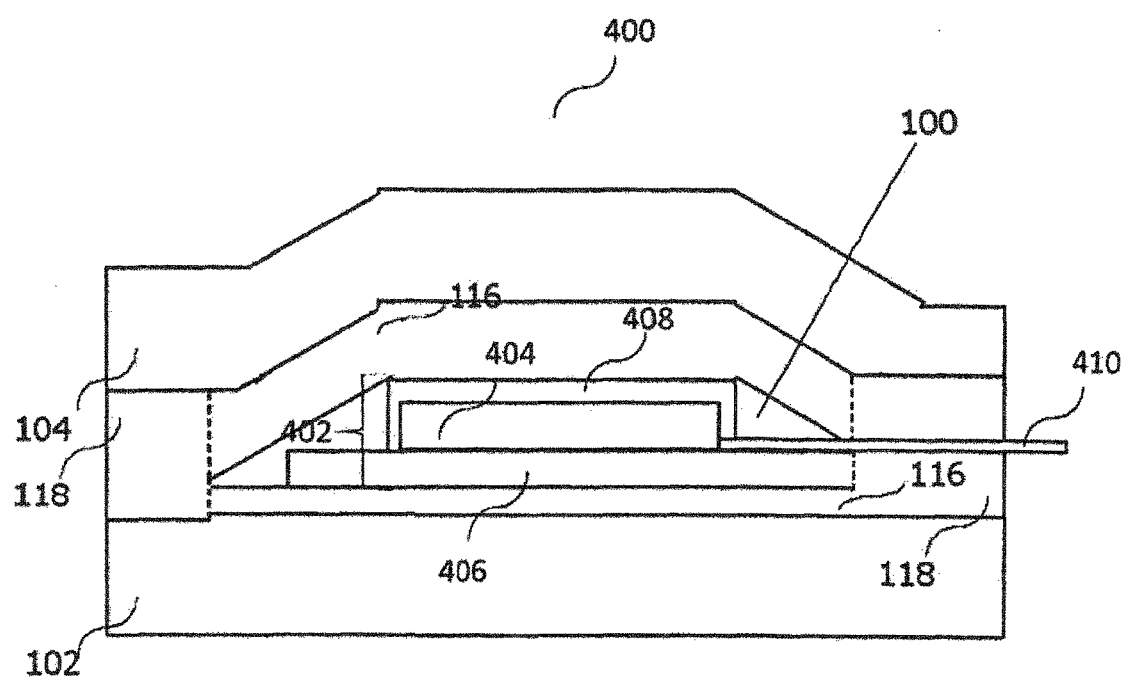
FIG. 4 shows a schematic cross-sectional view of an organic component packed using the encapsulation apparatus.

FIG. 4 shows a schematic cross-sectional view of an organic component packed by encapsulation apparatus 400.

A sheet-like component 402, for example an optoelectronic component, for example an organic light-emitting diode (OLED), can have an organically functional layer structure 404 on a component support 406, for example a glass support having a thickness of from about 0.1 to 5 nm, and can have mechanical protection 408, for example an epoxide. Electric contacting 410 ensures the supply of power to the organically functional layer structure 404. The component support 406 can be placed or fixed on or above the hermetically sealed first support 102. The areal dimension of the first support 102 is at least as large as or larger than the component support 406. The first support 102 can be mechanically rigid, for example glass having a thickness of 2 nm, and have a sheet-like surface of about 15×15 cm$^2$. Glass can have an intrinsic diffusion barrier against water and oxygen, so that an additional encapsulation layer 108 on the first support 102 can be omitted. The reactive surface 302 may include, for example, trimethylaluminum (TMA). The joiner layer 110 may include or be formed by the material alucone and/or $Al_2O_3$ resulting from TMA precursor and TMA precursor complement.

The hermetically sealed second support 104 is placed or fixed on or above the mechanical protection 408. The areal dimension of the second support 104 is at least as large as or larger than the mechanical protection 408 and additionally has a gap-free circumferential contact region 120 to the first support 102. The second support 104 may, for example, include a mechanically flexible PET film as system support 112 having a thickness of about 0.1 mm and a sheet-like surface of about 15×15 cm$^2$. As encapsulation layer 114, one or more oxide and/or nitride layers can be deposited in a thickness of 0.5 µm on the second system support 112, for example by PECVD and/or ALD processes. On or above the encapsulation layer 114, the second support 104 can have a joiner layer 114 of alucone having a layer thickness of about 0.1 µm. The reactive surface 304 of the joiner layer 114 may include the hydroxyl-containing TMA complement, for example ethylene glycol. It may be pointed out that in other examples the dimensions can also readily be selected differently and the dimensions indicated above by way of example do not have any restrictive character.

The first support 102 and the second support 104 form a provisory cavity. The component support 406, the first support 102 and second support 104 are aligned relative to one another so that the electric contacting 410 is located in the electric lead-through 212. The alignment of the component support 406, the first support 102 and the second support 104 relative to one another can be aided by topographical structuring 202, 204, 208, 210.

After alignment, the first support 102 and the second support 104 have chemically, topographically complementary reactive surfaces 302, 304 in the contact region 120. After alignment of the supports 102, 104 and the component 402, a hermetically sealed joining layer 108 can be formed from the reactive surfaces 302, 304 by locally increasing the temperature in the contact region 120. In this way, the provisory cavity becomes the hermetically sealed cavity 100.

The configuration 400 can be formed under reduced pressure. Production of the topographic structures 202, 204, 208, 210 and 212 can be effected by structuring of 110 and 116.

In a further example, the optoelectronic layer structure 404 with mechanical protection 408 can, for example, be produced directly on the glass plate 102, i.e. the component support 406 corresponds to the first system support 106 and the hermetically sealed first support 102, for example when the component support 406 is made of glass, for example a glass plate having a thickness of 2000 µm and a sheet-like surface of 15×15 cm². The sheet-like optoelectronic component 402 with mechanical protection 408 has a smaller areal dimension than the first support 102, for example a sheet-like surface of 14.5×14.5 cm², and a thickness of about 20 µm. The component 402 with mechanical protection 408 can be aligned centrally, i.e. axially symmetrically, on the first support 102. A joiner layer 110 composed of alucone and having a layer thickness of about 0.1 µm and a reactive TMA surface 302 can have been applied to the sheet-like periphery of the first support 102 without optoelectronic layer structure 404 and mechanical protection 408. As hermetically sealed second support 104, it is possible to use, for example, a PET film having a thickness of 500 µm and a sheet-like surface of 15×15 cm² as system support 112, and with an approximately 0.5 µm thick oxide and/or nitride layer as encapsulation layer 114. A joiner layer 116 composed of alucone and having a layer thickness of 0.1 µm can have been deposited on the surface of the encapsulation layer 114. The reactive surface 304 of the joiner layer 116 can have a layer of ethylene glycol as TMA complement atomically bound to the joiner layer. After alignment of the second support 104 relative to the first support 102, the joining layer 118 can be formed by a hot embossing process, with the punch in the hot embossing process being matched to the geometric edges of the supports 102, 104 with joiner layers 110, 116.

Figure 5:
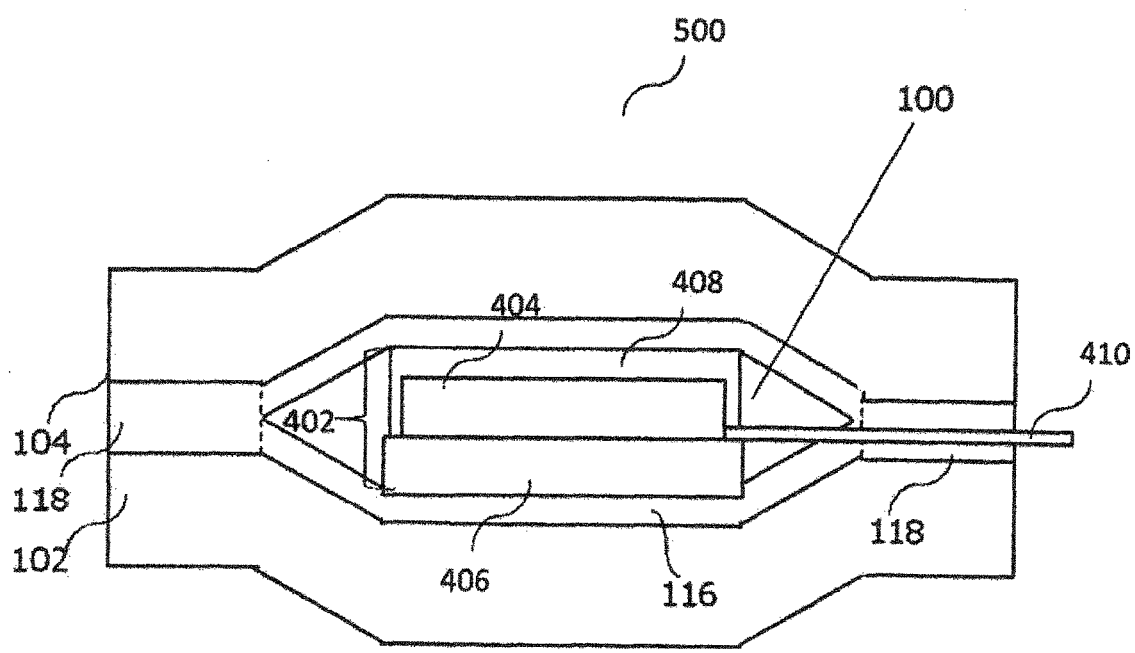
FIG. 5 shows a schematic cross-sectional view of an organic component packed using the encapsulation apparatus.

FIG. 5 shows a schematic cross-sectional view of an organic component packed using the encapsulation apparatus 500.

Mechanically flexible supports 102, 104 can be advantageous when the mechanically flexible properties of a flexible sheet-like component 402 are to be retained in the cavity 100; for example, the component support 406 can be formed by a polymer film, for example of PET, PEN, PC, PI having a layer thickness of 100 µm.

The first support 102 and the second support 104 can both be mechanically elastic, for example PET films 106, 112 having a thickness of 100 µm and a sheet-like surface of about 15×15 cm². As material for the encapsulation layers 108, 114, SiN can have been applied in a layer thickness of 0.5 µm to the films 106, 112. The reactive surface 302 of the first support may include, for example, terephthaloyl chloride. The reactive surface 304 of the second support can have a terephthaloyl chloride complement, for example p-phenylenediamine. The joiner layers 110, 116 may have a thickness of 0.1 µm and may include or be formed by the material poly(p-phenyleneterephthalamide) formed from the atomic bonding of terephthaloyl chloride and p-phenylenediamine.

Figure 6:
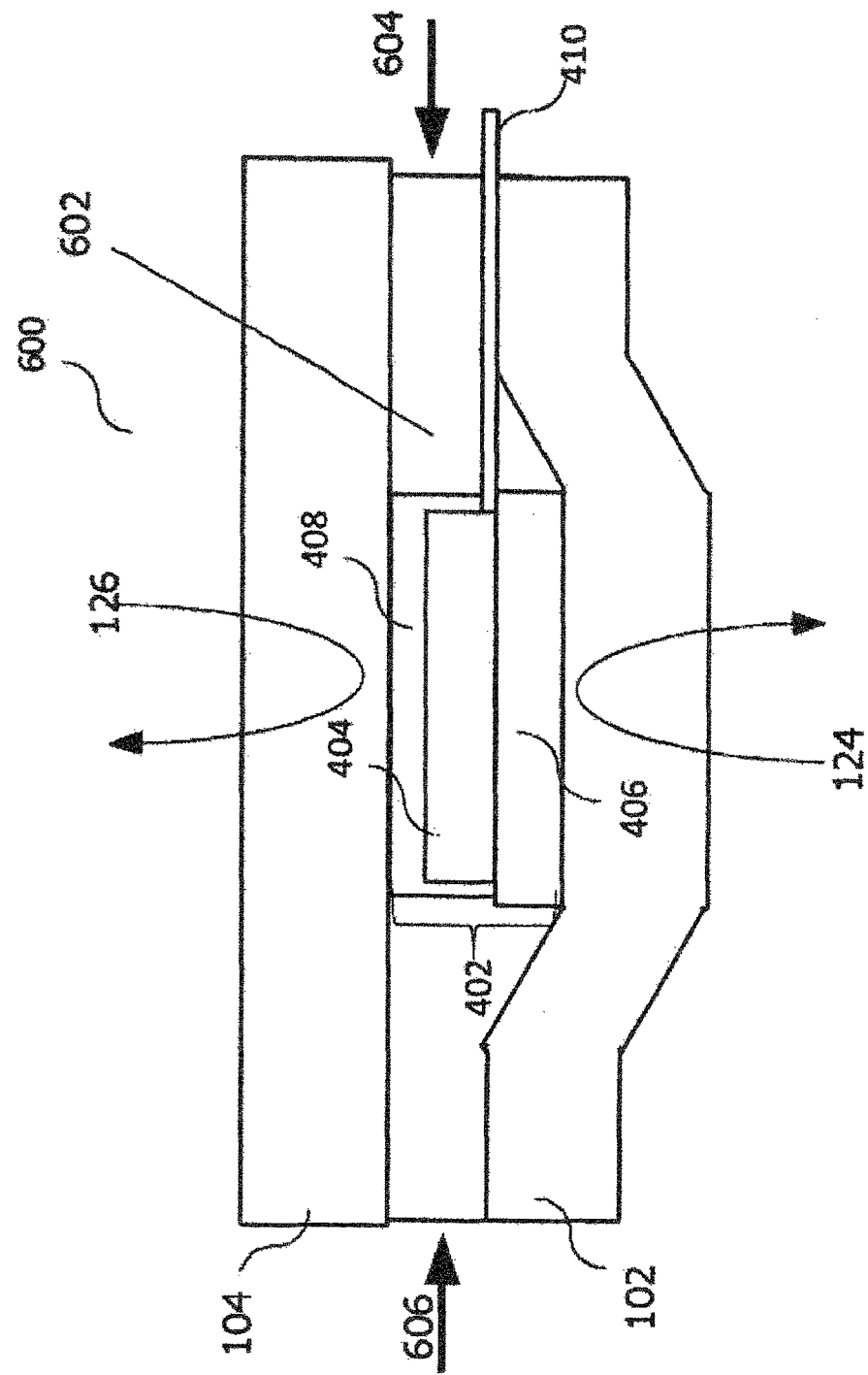
FIG. 6 shows a schematic cross-sectional view of an organic component packed using conventional encapsulation using barrier films.

FIG. 6 shows a schematic cross-sectional view of an organic component packed using a conventional encapsulation 600 with barrier films. In an encapsulation apparatus of an organic optoelectronic component 402 with laminated barrier films 102, 104, the barrier films 102, 104 are joined to one another conventionally using a lamination adhesive 602. The lamination adhesive 602 surrounds the component 402 and fills the space between the barrier films 102, 104. The optoelectronic component is protected by barrier films from water and oxygen from the direction of the barrier films 124, 126. However, water and oxygen can intrude from the side (indicated by the directional arrows 604) into the lamination adhesive 602 and the organic optoelectronic component 402.

Figure 7:
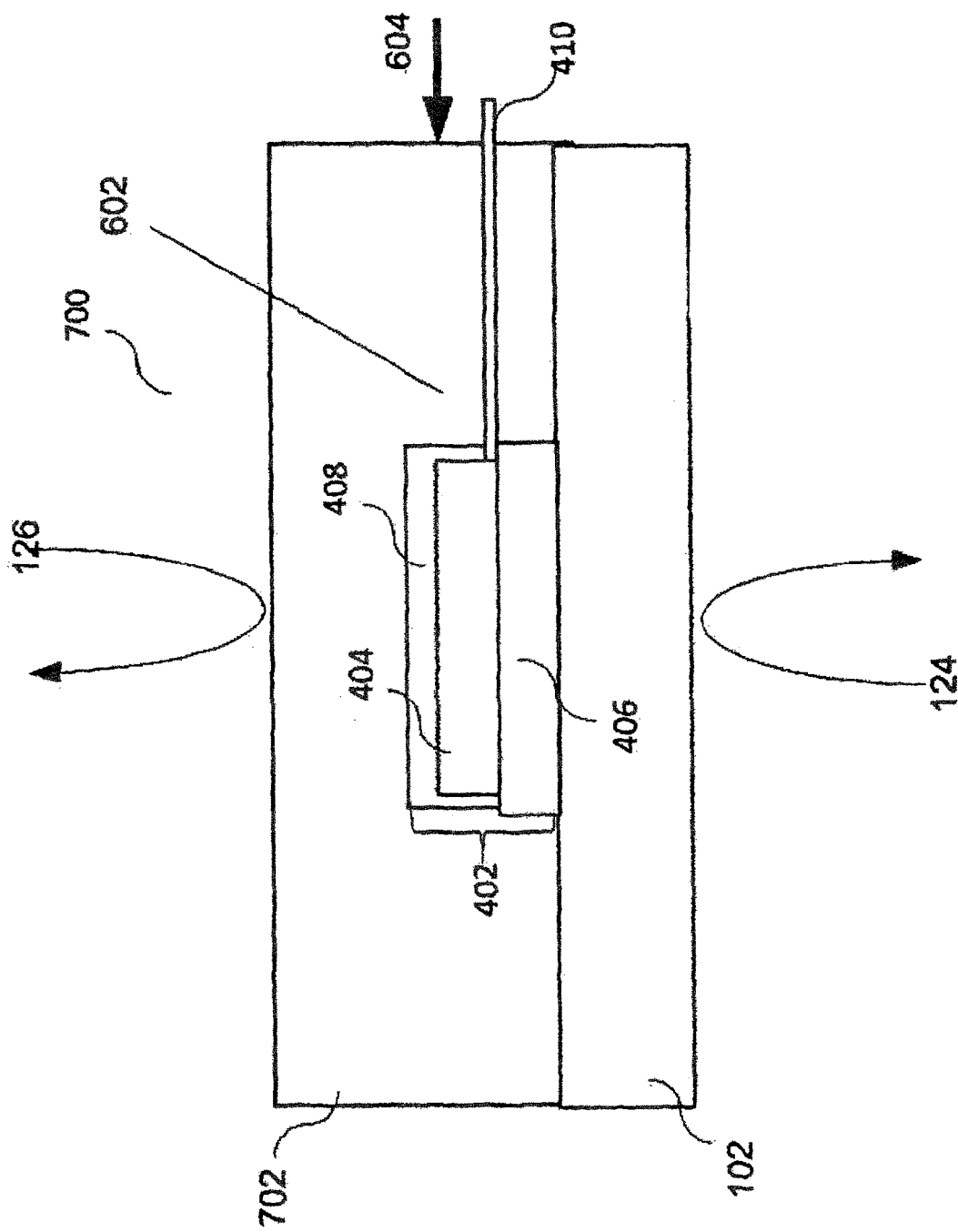
FIG. 7 a schematic cross-sectional view of an organic component packed using conventional in-situ thin film encapsulation.

FIG. 7 shows a schematic cross-sectional view of an organic component 402 packed using a conventional in-situ thin film encapsulation 700.

In an encapsulation apparatus of an organic optoelectronic component 402 with in-situ thin film encapsulation 700, the organic optoelectronic component 402 can be applied, for example produced or fixed, on a hermetically sealed support. A thin encapsulation layer 702 can be applied above or on the organic optoelectronic component 402 during production of the organic optoelectronic component 402 (in-situ). This in-situ method has the disadvantage of lengthening the process flow and not being able to be carried out independently of the process of producing the component to be encapsulated.

In various embodiments, apparatuses and a process for producing cavities which are hermetically sealed against water and oxygen, by which it is possible to encapsulate water- and oxygen-sensitive materials, mixtures of materials or components with barrier films in a hermetically sealed manner without adhesives, are provided. In this way, it is possible to very largely dispense with an in-situ encapsulation coating of the materials or components while nevertheless using any material for the supports. If a component support is additionally used as system support, barrier film can also be saved.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An apparatus having a hermetically-sealed organic component, the apparatus comprising:
 a first support covered with at least one ALD precursor and/or at least one MLD precursor; and
 a second support covered with at least one ALD precursor and/or at least one MLD precursor which is/are complementary to the ALD precursor and/or MLD precursor of the first support;
 wherein the first support is at least partly joined to the second support by an atomic bond between the ALD precursor of the first support and the ALD precursor of the second support or between the MLD precursor of the first support and the MLD precursor of the second support; and
 an ALD layer and/or MLD layer comprising a compound of the ALD precursor and/or MLD precursor of the first support continuously joined to the ALD precursor and/or MLD precursor of the second support so that the ALD layer and/or MLD layer has no gaps and encloses a cavity between the first support and the second support, and
 wherein an organic component is encapsulated in the cavity, the organic component having an organically functional layer structure between a component support and a mechanical protection,
 wherein the component support is placed or fixed on or above the first support and wherein the second support is placed or fixed on the mechanical protection.

2. The apparatus as claimed in claim 1, wherein the first support and the second support have a diffusion barrier against water and/or oxygen.

3. The apparatus as claimed in claim 1, wherein the cavity is hermetically sealed against diffusion flows of water and oxygen.

4. The apparatus as claimed in claim 1, wherein the surface of the first support or the surface of the second support is the component support of the component to be encapsulated or comprises the component to be encapsulated.

5. The apparatus as claimed in claim 1, wherein an aqueous liquid is encapsulated in the cavity between the first support and the second support by the hermetically sealed join.

6. The apparatus as claimed in claim 1, wherein the component is an organic light-emitting diode.

7. The apparatus as claimed in claim 1, further comprising an encapsulated lead-through for electric contacting the organic component within the cavity through the encapsulation.

8. The apparatus as claimed in claim 7, wherein the lead-through is arranged between the first support and the second support.

9. A process for producing an apparatus having a hermetically-sealed organic component, the process comprising:

applying at least one ALD precursor and/or at least one MLD precursor to a first support;

applying at least one ALD precursor and/or at least one MLD precursor to a second support, wherein the ALD precursor and/or the MLD precursor applied to the second support is complementary to the ALD precursor and/or MLD precursor applied to the first support; and joining of the at least one ALD precursor and/or the at least one MLD precursor applied to the first support to the complementary at least one ALD precursor and/or the complementary at least one MLD precursor applied to the second support;

wherein the first support is at least partly joined to the second support by an atomic bond between the ALD precursor applied to the first support and the ALD precursor applied to the second support or between the MLD precursor applied to the first support and the MLD precursor applied to the second support; and an ALD layer and/or MLD layer comprising a compound of the ALD precursor and/or MLD precursor of the first support continuously joined to the ALD precursor and/or MLD precursor of the second support so that the ALD layer and/or MLD layer has no gaps and encloses a cavity between the first support and the second support, and wherein an organic component is encapsulated in the cavity the organic component having an organically functional layer structure between a component support and a mechanical protection, wherein the component support is placed or fixed on or above the first support and wherein the second support is placed or fixed on or above the mechanical protection.

10. The process as claimed in claim 9, wherein the surface of the first support and/or of the second support is structured.

11. The process as claimed in claim 10, wherein a chemically structured and/or topographically structured surface of the first support is complementary to a chemically structured and/or topographically structured surface of the second support.

12. The process as claimed in claim 10, wherein the structuring of the first support and/or of the second support is formed by localized heating or by catalysis of the bonding process of the ALD precursor or MLD precursor.

13. The process as claimed in claim 10, wherein the surface of the first support and/or the surface of the second support is coated with a plurality of different ALD precursors and/or is coated with a plurality of different MLD precursors.

14. The process as claimed in claim 13, wherein the coating of the surfaces of the first support or of the second support with ALD precursor and/or MLD precursor forms reactive ALD precursors and/or reactive MLD precursors on the surface of the first support or second support.

* * * * *